United States Patent [19]

Laganza et al.

[11] Patent Number: 4,719,705
[45] Date of Patent: Jan. 19, 1988

[54] RETICLE TRANSPORTER

[75] Inventors: Joseph L. Laganza, East Norwalk; Orest Engelbrecht, Ridgefield, both of Conn.

[73] Assignee: The Perkin-Elmer Corporation, Norwalk, Conn.

[21] Appl. No.: 877,817

[22] Filed: Jun. 24, 1986

[51] Int. Cl.[4] .......................... B23Q 1/04; B25B 11/00; F16C 32/06
[52] U.S. Cl. ........................................ 33/568; 33/613; 33/DIG. 2; 269/21; 269/55; 384/12
[58] Field of Search ................. 33/180 R, 568, 573, 33/DIG. 2; 269/21, 35, 55, 58; 384/12

[56] References Cited

U.S. PATENT DOCUMENTS

| 3,393,648 | 7/1968 | Diehr | 33/DIG. 2 |
|---|---|---|---|
| 3,476,444 | 11/1969 | Dunfee | 384/12 |
| 3,831,283 | 8/1974 | Pagella et al. | 33/DIG. 2 |
| 4,013,280 | 3/1977 | Chitayat et al. | 33/568 |
| 4,455,910 | 6/1984 | Kraft et al. | 384/12 |
| 4,558,909 | 12/1985 | Stauber | 384/12 |
| 4,643,590 | 2/1987 | Olasz | 384/12 |

FOREIGN PATENT DOCUMENTS 1107721  3/1968  United Kingdom ............... 384/12

Primary Examiner—Richard R. Stearns
Attorney, Agent, or Firm—Thomas P. Murphy; Edwin T. Grimes; Francis L. Masselle

[57] ABSTRACT

The described invention is a precisely adjustable transporter for moving a reticle past an optical slit as a step in the production of semiconductor wafers. The reticle stage rides along a pair of optically flat planar, intersecting, bearing surfaces supported by air bearings on each bearing surface. Pressurized air and vacuum may be simultaneously employed to effect substantially friction-free motion while preventing displacement from the bearing surfaces. Axial adjustments on each air bearing permit precise adjustment of the reticle stage and reticle.

10 Claims, 5 Drawing Figures

RETICLE TRANSPORTER

TECHNICAL FIELD

This invention relates to apparatus for accurately transporting a reticle past an optical slit as a step in the production of semiconductor wafers.

BACKGROUND ART

Various techniques have been employed in the prior art to transport a reticle past an optical slit with high accuracy. One such approach moves the reticle arcuately by mounting it on the end of a pivoted arm which is then driven back and forth by a motor.

Another technique involves moving the reticle linearly by means of an air bar. An air bar may be thought of as an elongated bar of square cross section having precision lapped surfaces. Riding along the air bar is a square tube which carries the reticle. Pressurized air between the air bar and the tube provides substantially friction-free movement. However, with both the air bar and the pivoting arm approach, the number of possible adjustments of reticle position were limited.

DISCLOSURE OF INVENTION

A base member includes a horizontal bearing surface and a vertical bearing surface, each machined and lapped to optically flat specifications. A reticle stage is mounted in contact with both horizontal and vertical bearing surfaces by means of relatively widely spaced air bearings. The reticle stage is adapted to hold a precisely positioned reticle therein. Each air bearing includes a vacuum chamber and a plurality of pressure chambers positioned adjacent its respective bearing surface. It also includes precision axial adjustments and two-axis flexure members. Means are provided for connecting the vacuum chambers to a vacuum source and the pressure chambers to a source of pressurized air. Vacuum and air pressure are applied to the air bearing simultaneously whereby the air bearings are enabled to float along each bearing surface but, at the same time, the vacuum prevents their being displaced from each of the bearing surfaces. The reticle stage is propelled along the bearing surfaces by means of a linear motor.

BEST MODE FOR CARRYING OUT THE INVENTION

Figure 1:
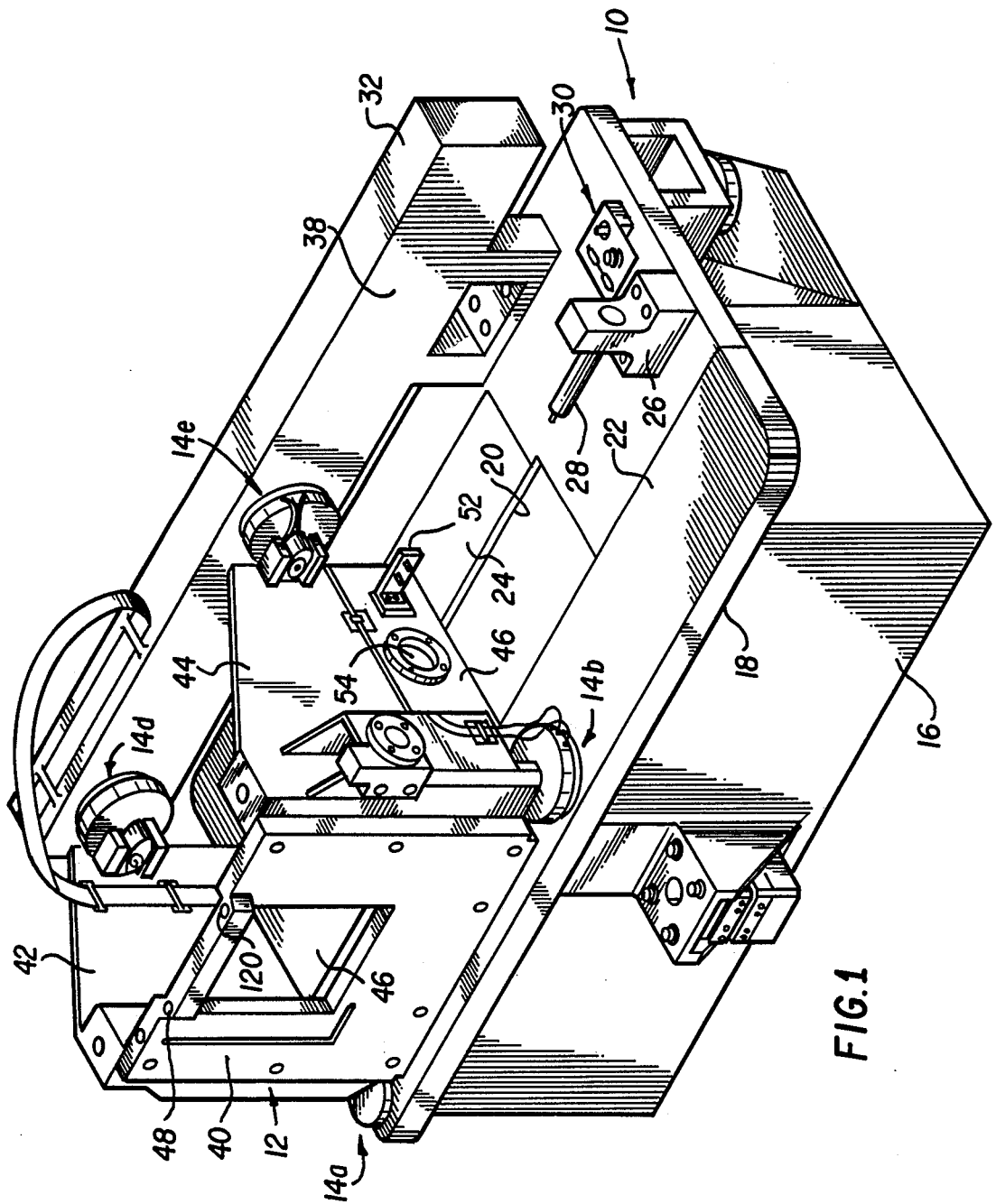
FIG. 1 is an isometric view of a reticle transporter in accordance with the invention.

The apparatus of the invention comprises a base assembly 10, upon which is mounted a reticle stage 12 which engages the base assembly by means of air bearings 14a–e. The base assembly 10 comprises a base frame 16 in the form of a substantially rectangular box which includes an upper plate 18 which defines rectangular central aperture 20. Upper plate 18 is horizontal and includes a precision lapped horizontal bearing surface 22 along its front edge (as viewed in FIG. 1) and a shorter horizontal bearing surface 24 extending along the back edge of the aperture 20. A support 26 at each end of the upper plate 18 carries a mechanical shock absorber 28 whose function will be described below. An electro-optical detector 30 is mounted on the upper plate 18 adjacent each of supports 26.

Figure 2:
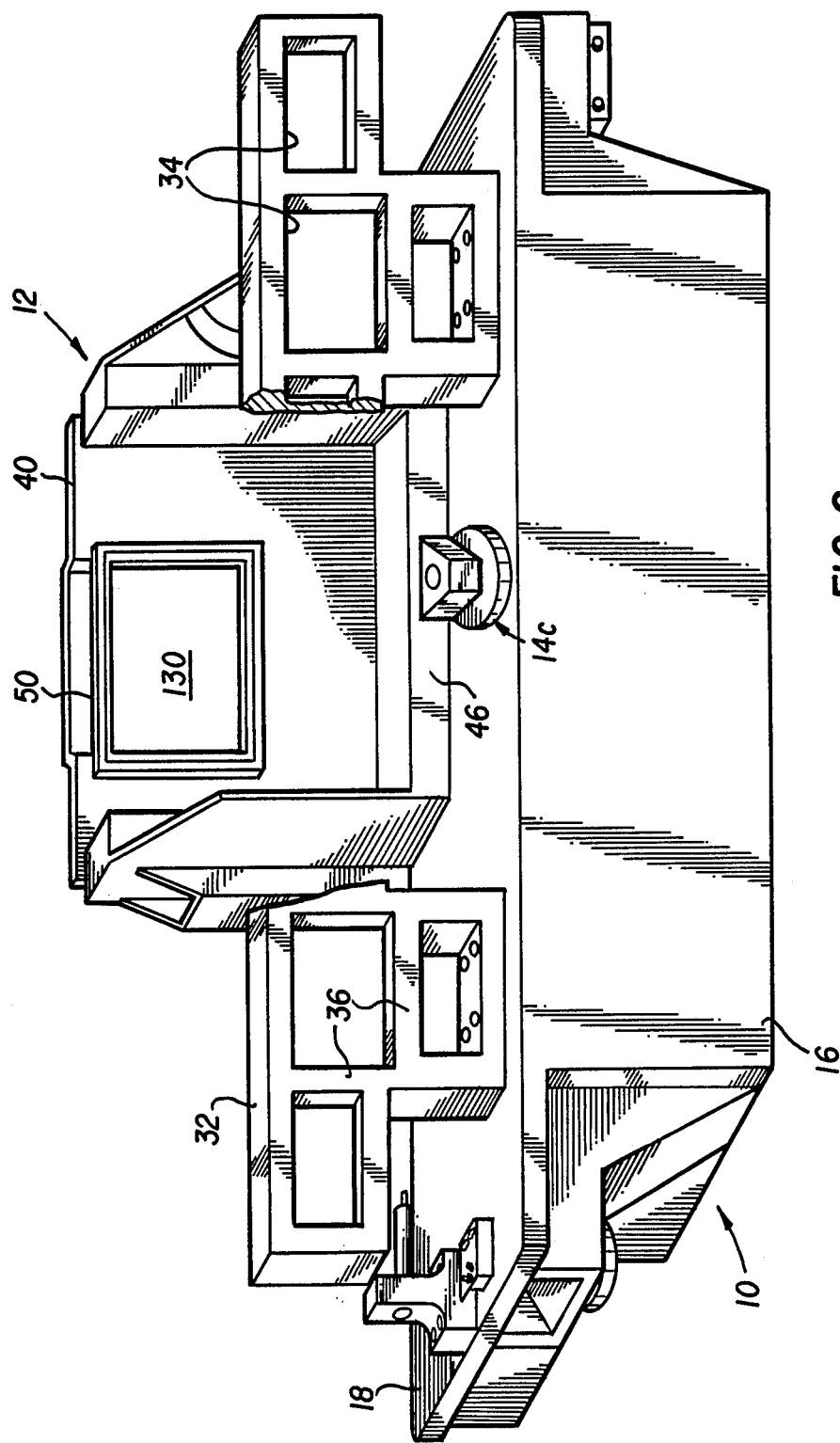
FIG. 2 is a rear view of the transporter of FIG. 1 with the vertical bearing surface partially broken away to illustrate the internal construction.

Extending upwardly from the rear of the upper plate 18 is a vertical wall 32. The wall 32 is "honeycombed" by the provisions of recesses 34 and ribs 36 in its rear surface as seen in FIG. 2. These minimize weight while increasing stiffness. The front surface of the vertical wall 32 includes a precision lapped, vertical bearing surface 38.

The reticle stage 12 is supported on the base assembly 10 for accurate linear travel therealong by means of air bearings 14 a–e, upon horizontal bearing surfaces 22, 24, and vertical bearing surface 38. The reticle stage 12 comprises a vertical reticle plate 40 which is generally rectangular and fastened at its ends to a pair of rearwardly extending left 42 and right 44 side frames which are interconnected by a central honeycombed cast block 46. The rear surface of the reticle plate 40 includes grooves which are connected to a vacuum port 48. These grooves thereby function as a vacuum chuck to securely retain a reticle frame 50 (FIG. 2). The reticle stage 12 is propelled back and forth along the base assembly 10 by means of a d.c. linear motor housed within base frame 16. A flag 52 mounted on the reticle stage 12 normally interacts with the electro-optical detector 30 to control the limits of travel. As a safety measure in the event of failure, a recessed cylindrical stop 54 is also carried by the reticle stage 12 to engage the shock absorber 28.

An important feature of this invention is the provision of the air bearings 14 a–e. It will be noted that the extremities of the reticle stage 12 carry air bearings 14a, 14b which rest upon the horizontal bearing surface 22 while a third, centrally positioned, air bearing 14c rests upon horizontal bearing surface 24. Air bearings 14d, 14e are carried respectively by the left side frame 42 and the right side frame 44 so as to bear against the vertical bearing surface 38.

Figure 3:
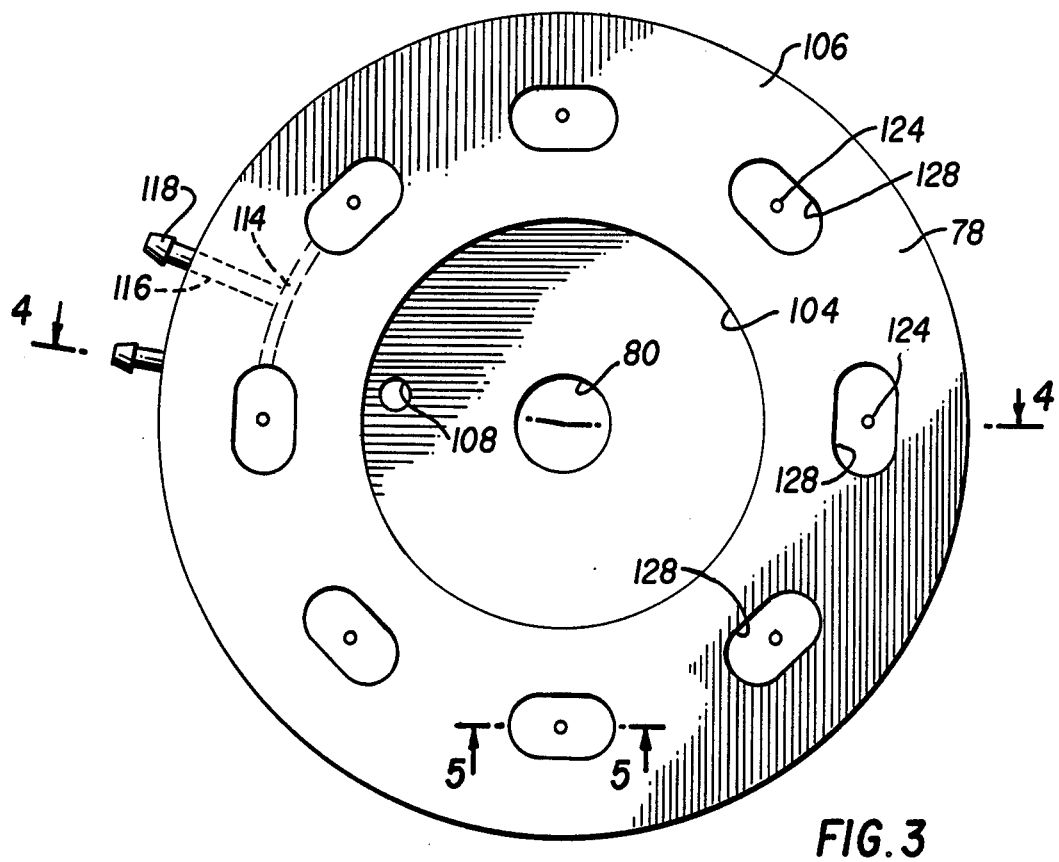
FIG. 3 is a bottom view of one of the air bearings employed in the invention.
Figure 4:
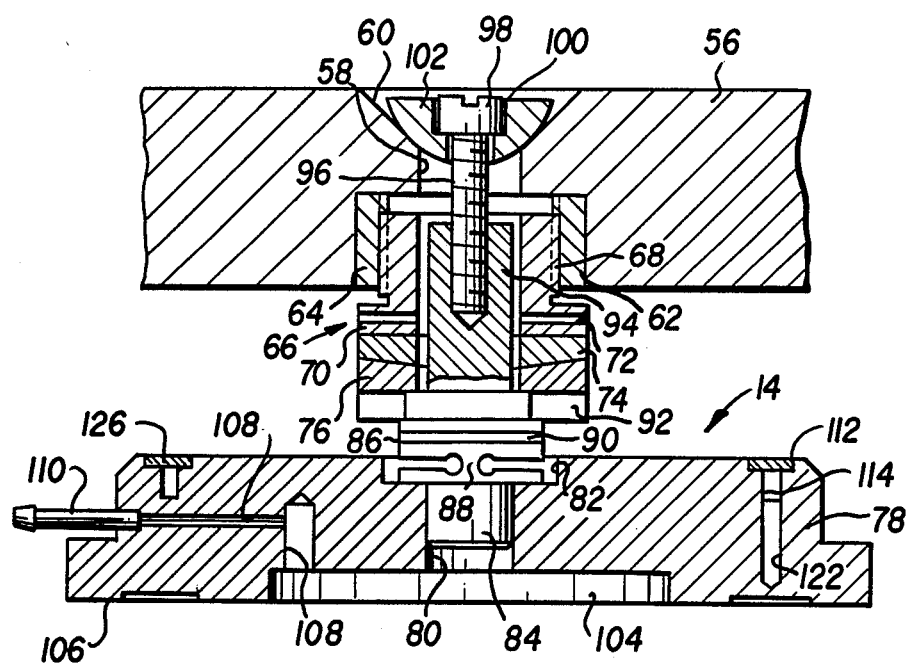
FIG. 4 is a cross-section taken substantially along the line 4—4 of FIG. 3.
Figure 5:
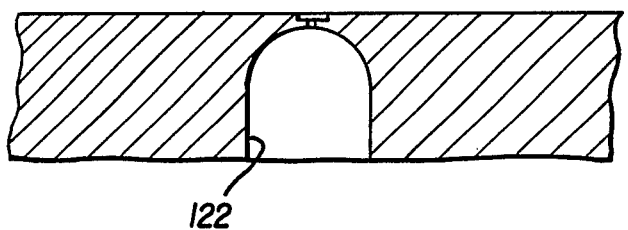
FIG. 5 is a greatly enlarged cross-section taken substantially along the line 5—5 of FIG. 3.

Details of a representative air bearing 14 are illustrated in FIGS. 3–5. With particular reference to FIG. 4, there is illustrated an exemplary structural member 56 to which air bearing member 14 is secured. In the embodiment particularly described above, member 56 would constitute a portion of the reticle stage 12. In the illustrated embodiment, the member 56 includes a drilled hole 58 therethrough which connects with a conical countersink 60 on one side of member 56 and an enlarged cylindrical opening 62 on the other side of member 56. An internally threaded cylindrical insert 64 is mounted within the opening 62. Threaded into the insert 64 is an adjuster 66. Adjuster 66 is hollow and includes an externally threaded shank 68 which is threaded into the insert 64 and an enlarged circular head 70 which includes a plurality of radial passages 72 for receiving adjustment tools. Mounted against the head 70 of the adjuster 66 is the planar surface of a planar-convex washer 74. The convex surface of the washer 74 rests on the concave surface of a mating, planar-concave washer 76.

A disk-shaped base portion 78 of air bearing 14, includes a central opening 80 therethrough terminating in an enlarged recess 82 in its upper surface as viewed in FIG. 4. Mounted within the opening 80 and recess 82 is a flexure post which comprises a stub 84 retained within the opening 80 and surmounted by a cylindrical flexure member 86. This member defines a pair of opposed co-planar slots which leave a diametrical web 88 therethrough which is seen from the end in FIG. 4. Immediately above the web 88 is another pair of orthogonally arranged co-planar slots which leave a second web 90 which is at right angles to the web 88. In one embodiment of this invention the flexure post is made of an aluminum alloy and the thickness of each web is 0.030 inch. Above the flexure member 86 is a head 92 from which an internally threaded post 94 extends into the adjuster 66 and is engaged by a screw 96 which has an enlarged head 98 retained in the central recess 100 of a spherical washer 102 positioned within countersink 60.

The base 78 of the air bearing defines an enlarged central vacuum chamber 104 in its lower bearing surface 106. The vacuum chamber 104 is connected by means of passages 108 and lines 110 to a vacuum source through, for example, the vacuum port 48 in FIG. 1. Girdling the upper surface of the base 78 is a slot 112 of rectangular cross-section and a similar, but narrower, groove 114 extends inwardly from the slot 112. The groove 114 is connectable to a pressurized air source via radial passage 116 and line 118. It may be connected, for example, to a pressurized air source through a pressure port 120 on the reticle stage 12. A plurality of holes 122 are drilled downwardly and nearly through the base 78 from the groove 114. In one actual embodiment, for example, wherein the outer diameter of the base 78 was 3.50", the holes 122 were 0.062" in diameter and extended to within 0.010" of the bearing surface 106. From the bottom of each of holes 122, a 0.003" hole 124 was drilled through the bearing surface 106. An annular ring 126 was inserted into the slot 112 to isolate the pressurized air system from atmosphere. The bearing surface 106 was lapped to an optical surface tolerance approximating that of two wavelengths of ultraviolet light. After lapping, an oval depression 128 was formed in the bearing surface 106 surrounding each of the holes 124. The depth of each of these depressions was 0.0003" to 0.0006". For further details of the dimensions of the specific embodiment described above, reference may be had to the enlarged cross-section of FIG. 5. The width of each of the oval depressions is 0.28". Some simple calculations reveal that the area of each is 0.1232 in.$^2$ and the total area of the eight is 0.9856 in.$^2$ The diameter of vacuum chamber 104 is 1.75" and, accordingly, its area is 2.4 in.$^2$.

Operation

A reticle 130 is placed within a reticle frame 50 and is precisely aligned in an alignment fixture tool which forms no part of this invention and is, accordingly, not shown. The reticle frame 50 and its reticle 130 are then mounted on the reticle plate 40 and, after alignment, are held by means of vacuum. The reticle stage 12 is capable of precision linear movement along an X axis. Air pressure, supplied to the depressions 128 in the bearing surface 106 of each of the air bearings 14, provides films of air which enable the reticle stage 12 to float freely on the precision lapped surfaces 22, 24, and 38. Furthermore, the vacuum supplied to the vacuum chamber 104 of each of the air bearings 14 holds these bearings firmly against the bearing surfaces and prevent displacement therefrom. Thus, there will be seen to be a novel balance between the free linear movement permitted by the air pressure and the constraints against removal provided by vacuum.

Each of the air bearings 14 is axially positionable by loosening screw 96, rotating the adjuster 66 to a desired position and then retightening screw 96. The flexure member 86 provides planar compliance for each air bearing assembly 14. The combination of three widely spaced air bearings against each of the horizontal and vertical bearing surfaces coupled with precise axial positioning of each bearing results in highly accurate adjustment of the reticle carried by the reticle stage. The flags 52 and electro-optical detectors 30 control the precisioned deceleration and stopping of the reticle stage 12. The linear position of the reticle stage 12 may be monitored by a retro-reflector mirror carried by the reticle stage and a remote laser gauge. The mechanical shock absorbers 28 are provided in the event of an emergency hard stop.

Under some circumstances, it might be desirable to employ a gas other than air—nitrogen, for example— for the "air bearings". It will also be apparent that a number of other variations and modifications ma be made in this invention without departing from its spirit and scope. Accordingly, the foregoing description is to be construed as illustrative only, rather than limiting. This invention is limited only by the scope of the following claims.

We claim:

1. Apparatus for precisely and rapidly transporting a reticle past an optical slit which comprises:
    a base member having thereon a first planar bearing surface and a second planar bearing surface, said first and second bearing surfaces lying in intersecting planes whereby they are angularly disposed relative to each other;
    a reticle stage linearly movable along the line of intersection of said planes;
    three triangularly disposed gas bearings mounted on said reticle stage for supporting it on each of said first and second bearing surfaces, each of said gas bearings having planar supporting surface movable along one of said first and second bearing surfaces, said supporting surface defining a vacuum chamber and a plurality of pressure chambers adjacent its respective bearing surface;
    means for simultaneously connecting said vacuum chamber to a vacuum source and said pressure chamber to a pressurized gas source whereby pressurized gas permits essentially friction-free movement of said reticle stage along said bearing surfaces while vacuum prevents movement of said reticle stage away from said bearing surfaces; and
    means for propelling said reticle stage along said bearing surfaces.

2. The apparatus of claim 1 wherein the intersecting planes are substantially perpendicular.

3. The apparatus of claim 2 wherein one of said planes is substantially horizontal and the other is substantially vertical.

4. The apparatus of claim 1 wherein each of said gas bearings includes means for adjustably spacing the bearings from the reticle stage.

5. The apparatus of claim 4 wherein said spacing means comprises:
    a female screw thread on one of said reticle stage and gas bearing;

a male screw thread on the other of said reticle stage and gas bearing in threaded engagement with said female screw thread;

means for rotating said screw threads relative to one another to vary said spacing; and means for clamping said screw threads in a desired relationship.

6. The apparatus of claim 5 wherein said clamping means comprises means for selectively applying compressive force across said engaged screw threads.

7. The apparatus of claim 6 wherein said male thread is carried on the outer surface of a tubular member and said compressive force applying means comprises:

a post extending through said tubular member from one of said reticle stage and gas bearing; and a locking member extending through said tubular member from the other of said reticle stage and gas bearing in threaded engagement with said post.

8. The apparatus of claim 7 wherein said post includes orthogonal flexure webs therein.

9. The apparatus of claim 8 wherein said locking member comprises a bolt and means carried by the reticle stage for retaining the head of said bolt.

10. The apparatus of claim 9 wherein said retaining means comprises a spherical washer positioned in a spherical seat.

* * * * *